United States Patent
Robinson et al.

(10) Patent No.: US 12,274,024 B2
(45) Date of Patent: Apr. 8, 2025

(54) COOLING DEVICE FOR COOLING COMPONENTS OF A CIRCUIT BOARD

(71) Applicant: Nexalus Limited, Cork (IE)

(72) Inventors: Anthony Robinson, Cork (IE); Cathal Wilson, Cork (IE); Kenneth O'Mahony, Cork (IE)

(73) Assignee: Nexalus Limited, Cork (IE)

( * ) Notice: Subject to any disclaimer, the term of this patent is extended or adjusted under 35 U.S.C. 154(b) by 163 days.

(21) Appl. No.: 18/017,727

(22) PCT Filed: Jul. 7, 2021

(86) PCT No.: PCT/EP2021/068865
§ 371 (c)(1),
(2) Date: Jan. 24, 2023

(87) PCT Pub. No.: WO2022/022966
PCT Pub. Date: Feb. 3, 2022

(65) Prior Publication Data
US 2023/0254995 A1   Aug. 10, 2023

(30) Foreign Application Priority Data

Jul. 27, 2020   (GB) ..................................... 2011601

(51) Int. Cl.
*H05K 7/20* (2006.01)
*G06F 1/20* (2006.01)

(52) U.S. Cl.
CPC .......... *H05K 7/20254* (2013.01); *G06F 1/20* (2013.01); *H05K 7/20436* (2013.01); *G06F 2200/201* (2013.01)

(58) Field of Classification Search
CPC . H01L 23/473; H01L 23/427; H01L 23/4735; H01L 21/4882; G06F 1/20;
(Continued)

(56) References Cited

U.S. PATENT DOCUMENTS

| 10,548,240 B1* | 1/2020 | Iyengar ............. H05K 7/20509 |
| 2009/0218078 A1* | 9/2009 | Brunschwiler ........... G06F 1/20 361/679.53 |

(Continued)

*Primary Examiner* — Mandeep S Buttar
(74) *Attorney, Agent, or Firm* — Stephen T. Scherrer; Monique A. Morneault; Scherrer Patent & Trademark Law, P.C.

(57) ABSTRACT

A cooling device for cooling electronic components comprising a primary electronic component, and one or more secondary electronic components of a circuit board is provided. The cooling device comprises a first cooling component. The first cooling component comprises a first cooling member configured to contact a surface of the primary electronic component. The first cooling member is configured to be in fluid communication with a fluid to effect an operative convection cooling of the surface of the primary electronic component. The cooling device further comprises a second cooling component. The second cooling component comprises a second cooling member configured to contact a respective thermal surface of the one or more secondary electronic components to effect an operative conduction cooling of the one or more secondary electronic components. The second cooling member is thermally coupled to the first cooling member.

15 Claims, 7 Drawing Sheets

(58) Field of Classification Search
CPC .......... G06F 2200/201; H05K 7/20345; H05K 7/20254; H05K 7/20272; H05K 7/20727; H05K 7/20509; F28F 2260/02; F28F 2215/00
USPC ........................................................ 361/699
See application file for complete search history.

(56) References Cited

U.S. PATENT DOCUMENTS

| | | | |
|---|---|---|---|
| 2022/0065549 A1* | 3/2022 | Zhou | F28D 15/0275 |
| 2023/0015149 A1* | 1/2023 | Silverman | H01L 23/4735 |
| 2024/0032242 A1* | 1/2024 | Ferrer Medina | H05K 7/20772 |

* cited by examiner

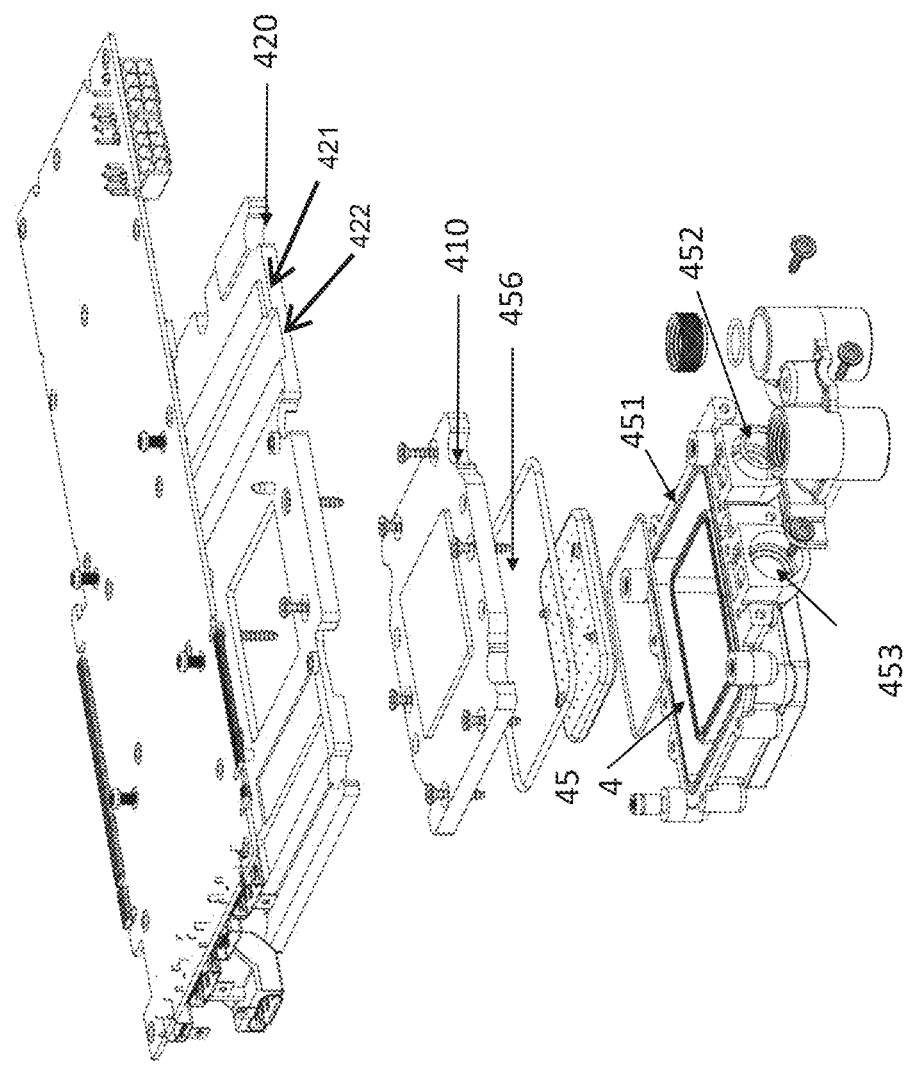

COOLING DEVICE FOR COOLING COMPONENTS OF A CIRCUIT BOARD

FIELD

The present teaching relates to the cooling of electronic components on a shared circuit board. The present teaching more particularly relates to a cooling device to effect cooling of a multi-chip module comprising a primary electronic component and one or more secondary electronic components.

BACKGROUND

Electronic components generate heat when performing their electrical service. Many computing systems incorporate a number of discrete electronic components on a shared circuit substrate, referred to generally as a card or a board. Each of the discrete components perform specific tasks, the complexity of which varies. Some of these computing components, especially those relatively high-powered, computational expensive components such as central processing units (CPUs) and graphics processing units (GPUs) can generate a tremendous amount of heat during operation. It is thus critical to provide effective cooling to remove the waste heat generated to ensure that the electronic components are maintained within their permissible operating temperature limits.

Various types of computer coolers have been developed based on different cooling mechanisms. In general, existing coolers are either air-based or liquid-based. Between the two, liquid-based cooling provides advantages over air-based cooling due to better thermophysical properties, such as the higher thermal conductivity, density and specific heat capacity of liquid compared with air. Liquid-based cooling thus provides higher cooling effectiveness, consumes less power and thus has a smaller environmental footprint for providing more sustainable cooling solutions.

Although processing electronic components such as CPUs and GPUs are typically the main source of waste heat, secondary electronic components nevertheless generate significant amount of heat during operation. If not cooled, the heat generated by those ancillary electronic components may not only affect the operation of the ancillary electronic components themselves, but also contribute deleteriously to the performance of the primary processing electronics component, the long term reliability of the integrated board and to increasing the ambient temperature.

It is therefore desirable to cool not only the primary electronic components but also the ancillary electronic components to ensure correct and reliable operation of the electronic device.

A graphics card for example is a standalone plug-in board which contains a high-powered primary processing unit, a GPU, along with an array of lower-powered secondary electronic components to support the GPU and graphics card function. The secondary electronic components may include one or more voltage regulator module (VRM) chips, random-access memory (RAM) chips, various other smaller components, etc. A schematic of a typical graphics card having various electronic components integrated onto a mother board is shown in FIG. 1. An example of a known graphic card of this type may be Nvidia GEForce 2080Ti graphics card. Although a GPU is the main source of waste heat, VRM and RAM chips also generate a significant amount of heat during operation which requires cooling.

Graphics cards pose a significant thermal design challenge because they are multi-chip modules (MCMs). Such a multi-chip configuration raises challenges in thermal design. A main challenge is that there are multiple components that require cooling (e.g. GPU, VRM, and RAM), and these components are spread over a relatively large area.

A further challenge is that the power loading and maximum allowable operating temperature of the various components are different. For example, the GPU is a high-powered device and must run as close to optimal operating temperature as possible and thus requires intensive cooling. The VRM chips on the other hand are low-powered components with a much wider range of operating temperature limits, and thus do not require the same level of cooling as the GPU.

In the context of liquid cooling which is highly desirable due to its enhanced cooling performance and compactness compared with air cooling, the aforementioned graphics card cooling challenges are exacerbated by hydraulic limitations. There are limitations with regard to the volume flow of water available for cooling. Since the volume flow of coolant at the chip level defines its effectiveness in cooling the chip, dividing or spreading this flow over a large area and/or to multiple chips may diminish the overall cooling effectiveness. This is not ideal since the GPU is the main component of the graphics card and requires the highest level of cooling.

Existing liquid-cooled graphics card thermal management technologies have taken the "collateral damage" approach. This means that the limited liquid coolant supply is diverted from the GPU to cool the ancillary components. FIG. 2 illustrates a known liquid-based cooling device adopting such a "collateral damage" approach for cooling a graphics card. The cooling device shown in FIG. 2 has a metal plate which is pressed over the board, making contact with GPU, RAM and VRM chips via a thermal interface material (TIM). A metal or plastic cover plate is sealed to the top-side of this plate and the coolant is channelled over its entire area, with some conduits and possible machined fins to improve local heat transfer.

There are several problems with such an approach: (i) the approach suffers from ineffective cooling of the GPU since the scarce coolant resource and associated overall cooling potential is diverted from the GPU, the component that demands the highest level of cooling; (ii) the approach is power intensive as significant amount of power is required in order to ensuring the hydraulic performance across the entire area of the graphics card; and (iii) the approach further suffers from inability to adapt to suit various graphics cards designs since every graphics card architecture and each subsequent new release requires a ground-up thermal-hydraulic design.

There therefore exists a need for a cooling solution for cooling MCMs which overcomes at least in part the disadvantages identified above.

SUMMARY

In accordance with the present teaching, these and other problems are addressed by a cooling device for cooling multiple electronic components on a shared circuit board.

Accordingly, the present invention provides a device as detailed in independent claims. Advantageous embodiments are provided in the dependent claims.

It is an aim of the present invention to provide a cooling device suitable for cooling MCMs such as graphics cards with high-performance and improved efficiency as well as versatility in configuration.

According to an aspect of the present invention, there is provided a thermal cooling device for cooling electronic components of a circuit board. The electronic components may comprise a primary electronic component, and one or more secondary electronic components. The cooling device may comprise a first cooling component. The first cooling component may comprise a first cooling member configured to contact a surface of the primary electronic component. The first cooling member may be configured to be in fluid communication with a fluid to effect an operative cooling of the thermal surface of the primary electronic component. The cooling device may comprise a second cooling component. The second cooling component may comprise a second cooling member configured to contact a respective thermal surface of the one or more secondary electronic components to effect an operative conduction cooling of the one or more secondary electronic components. The second cooling member may be thermally coupled to the first cooling member.

According to some embodiments of the invention, the second cooling component may extend about a perimeter of the first cooling component.

According to some embodiments of the invention, operatively a thermal joint region may be defined between each of the first cooling component and the second cooling component. The thermal joint region may extend about a perimeter of the primary electronic component forming a temperature depression at the perimeter of the first cooling component.

According to some embodiments of the invention, each of the first and second cooling members may be separate and distinct members. The second cooling member may physically abut the first cooling member.

According to some embodiments of the invention, each of the first and second cooling members may be formed from a common substrate or are integrally formed with one another.

According to some embodiments of the invention, the second cooling member may have a first cooling proximal region and a first cooling distal region. The second cooling member may be thermally coupled to the one or more secondary electronic components at the first cooling distal region.

According to some embodiments of the invention, operatively, a thermal gradient may be established between the first cooling proximal region and the first cooling distal region such that heat generated by the one or more secondary components will thermally pass to the first cooling component.

According to some embodiments of the invention, the first cooling member has a first footprint and the second cooling member has a second footprint. The first footprint may be smaller than the second footprint.

According to some embodiments of the invention, the first cooling component may be configured to effect an operative convection cooling of a first surface area of the first cooling member. The first surface area may at least overlap a footprint of the primary electronic component.

According to some embodiments of the invention, the first surface area may be larger than the footprint of the primary electronic component.

According to some embodiments of the invention, the second cooling member may be a conduction plate. The conduction plate may comprise a first region having a first thickness and a second region having a second thickness, the first thickness being larger than the second thickness.

According to some embodiments of the invention, the first region may overlap a first set of the one or more secondary electronic components and the second region may overlap a second set of the one or more secondary electronic components.

According to some embodiments of the invention, the device may further comprise a third cooling component comprising a third cooling member configured to effect an operative conductive cooling of one or more tertiary electronic components. The third cooling member may be thermally coupled to the second cooling member.

According to some embodiments of the invention, when the first cooling member and second cooling member are separate and distinct members, the first cooling member is formed from a first conductive material and the second cooling surface is formed from a second conductive material. The first conductive material may be different to the second conductive material.

According to some other embodiments, the first cooling member and the second cooling members may be formed from the same conductive material.

According to some embodiments of the invention, the first cooling member may have a thickness that is different to the thickness of the second cooling member.

According to some embodiments of the invention, the first cooling member may be formed from copper and the second cooling member may be formed from aluminium.

According to some embodiments of the invention, the second cooling member may define one or more thermal conduction channels. The thermal conduction channels define thermal conduction paths along which heat will preferentially pass.

According to some embodiments of the invention, the first cooling component may comprise a housing defining a chamber configured to facilitate circulation of the fluid. The first cooling component may further comprise a conduction plate extending sidewardly from the housing. The thermal depression is operatively formed in the conduction plate.

According to some embodiments of the invention, the chamber may enclose a jet orifice plate through which the fluid impinges on the first cooling member to effect an operative convection cooling of the first cooling member. This operative convection cooling effects a corresponding operative cooling of the primary electronic component.

According to some embodiments of the invention, the convection cooling operatively effected by the first cooling component has a first cooling effectiveness. The conduction cooling operatively effected by the second cooling component has a second cooling effectiveness lower than the first cooling effectiveness so as to operatively form the temperature depression at the perimeter of the first cooling component.

In summary, the device according to the various embodiments described herewith provides a targeted liquid-based cooling of the primary electronic component 110 to maximize cooling in this thermally critical region. Cooling of secondary components on the same shared board is effected by conductive heat transfer of the heat away from these components. This heat is then transferred into the same liquid coolant that is used for the primary electronic component 110. The present teaching provides effective and efficient cooling to multi-chip modules or in fact any circuit boards with multiple electrical or electronic components that may require different level or targeted cooling. The device according to the various embodiments of the invention can also be easily adapted for cooling MCMs of various configurations comprising more than one primary electronic component 110s and corresponding secondary or tertiary electronic component.

Compared with the conventional "collateral damage" approach, the present teaching offers improved thermal management of MCM cooling since the device is engineered to focus high-level cooling on mission-critical component on the board. The innovative implementation of a thermal joint and the corresponding resultant cold zone between the convection cooling component and a thermal bus plate which provided the conduction cooling triggers heat diffusion from the heated peripheral secondary electronic components to the cold zone created around the primary electronic component, which is ultimately transported to the convection cooling component. By focusing all of the available coolant centrally at the high-powered primary electronic component, it is possible to intensively cool the mission-critical component as well as the conduction plate which in turn cools the one or more peripheral secondary electronic components. The result is targeted high-performance convection-based cooling where it is crucial and conduction-based cooling on the less critical electronics on the board. The cooling potential of a compact convection-based cooler with a limited volume of coolant is thus optimally exploited to achieve an effective, targeted, and versatile cooling of multiple components of an MCM with high efficiency.

BRIEF DESCRIPTION OF THE DRAWINGS

The present application will now be described with reference to the accompanying drawings in which:

FIG. 4a is a schematic exploded view of the device of FIG. 3 in accordance with the present teaching.

DETAILED DESCRIPTION

Figure 1:
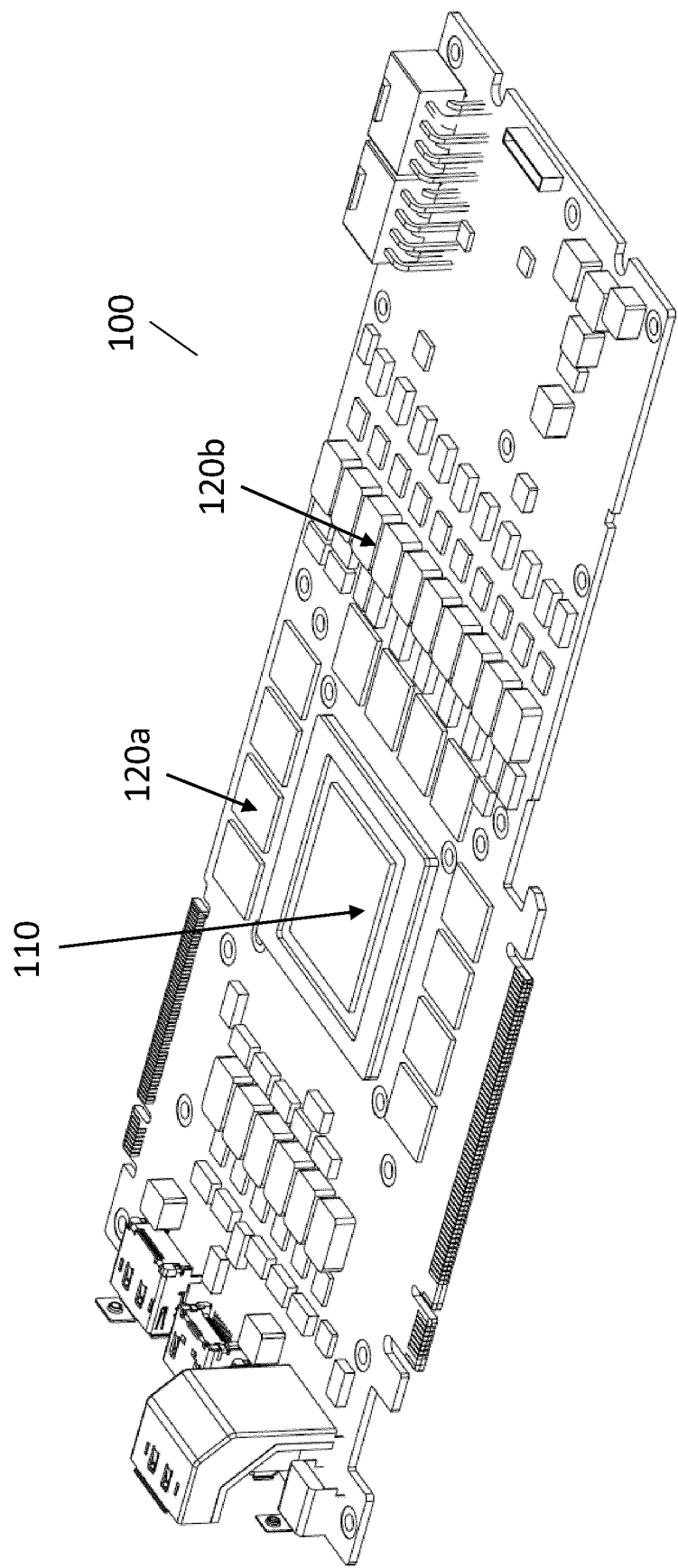
FIG. 1 is a schematic of a typical graphics card as an example of a MCM which may be suitably cooled using a cooling device in accordance with the present teaching.
Figure 2:
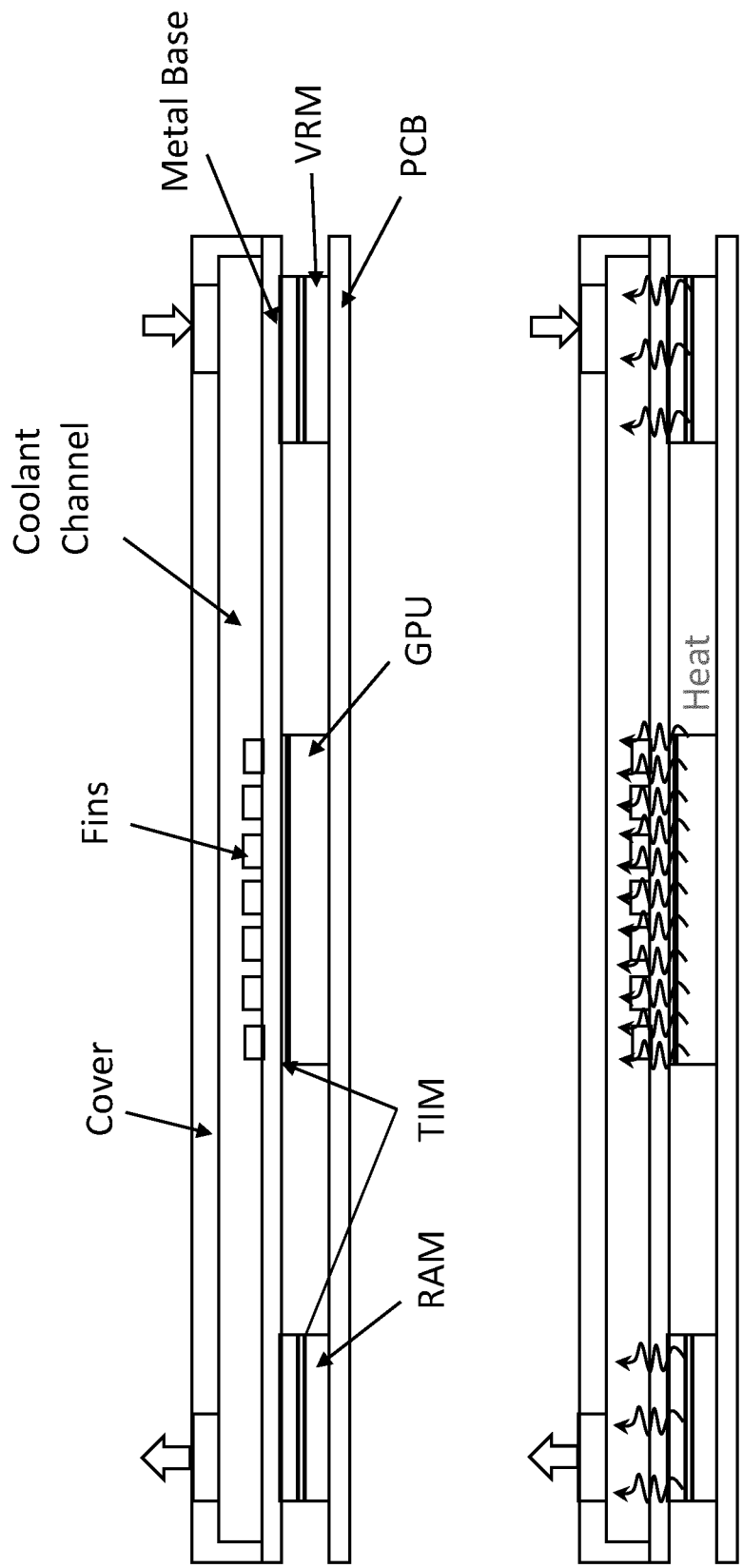
FIG. 2 is a schematic showing a known liquid-based cooler for cooling a graphics card.

The present invention will now be exemplified with reference to the accompanying drawings.

A number of terms used in describing various embodiments of the present invention may be used synonymously or interchangeably. For example, the term "ancillary" may be used synonymously with "secondary" or "tertiary". The term "circuit board" may be used synonymously with "printed circuit board", "board", or "motherboard". The term "electronic components" may be used synonymously with "electronics" to refer to various types "integrated circuits", "chips" or any other types of electronic components. The term "liquid-based cooler" may be used synonymously with "liquid cooler" or "waterblock". As used herein, and unless the context dictates otherwise, the term "coupled to" or "connected to" is intended to include both direct coupling or connection (in which two elements that are coupled or connected to each other contact each other) and indirect coupling or connection (in which at least one additional element is located between the two elements). Therefore, the terms "coupled to", "coupled with", "connected to" and "connected with" are used synonymously.

The following discussion provides many exemplary embodiments of the inventive subject matter. Although each embodiment represents a single combination of inventive elements, the inventive subject matter is considered to include all possible combinations of the disclosed elements. Thus, if one embodiment comprises elements A, B, and C, and a second embodiment comprises elements B and D, then the inventive subject matter is also considered to include other remaining combinations of A, B, C, or D, even if not explicitly disclosed.

For simplicity and clarity of illustration, reference numerals may be repeated among the figures to indicate corresponding or analogous elements. Numerous details are set forth to provide an understanding of the examples described herein. The examples may be practiced without these details. In other instances, well-known methods, procedures, and components are not described in detail to avoid obscuring the examples described. The description is not to be considered as limited to the scope of the examples described herein.

According to an embodiment of the present invention, a device for cooling electronic components on a circuit board is provided. The circuit board may be any type of circuit board having multiple electronic components integrated thereon. For example, such a circuit board may be a printed circuit board (PCB) comprising multiple integrated circuits or chips forming a multi-chip module (MCM). Examples of such circuit boards include but not limited to for example CPU cards or graphics cards. The electronic components may comprise at least one primary electronic component, or simply "primary component". The at least one primary electronic component 110 may be a processing unit. The electronic components also comprise one or more secondary electronic components. The secondary electronic components 120 may be peripheral ancillary components which are configured to support the function of the primary component. However, it should be noted that the primary and secondary electronic components are distinguished, in the context of the present teaching, mainly based on their power loadings and maximum allowable operating temperatures rather than their functionality. A primary electronic component such as a processing unit is typically high-powered and therefore generates a large amount of heat during operation which in turn requires high-level intensive cooling in order to keep the component within its permissible operating temperature limit. A secondary electronic component on the other hand is typically low-powered and requires relatively low-level cooling compared with the primary electronic component. A primary electronic component is typically located in the central region of a circuit board with secondary and tertiary electronic components arranged about, or peripheral to, the primary electronic component. However, it will be appreciated that relative positioning and arrangement of primary, secondary, and tertiary electronic components may vary depending on designs of MCMs. Accordingly, a cooling device according to the present teaching may adopt various configurations that are compatible with and can be fitted to different MCMs.

An exemplary MCM which may be suitably cooled using the device of the present teaching is a graphics card, such as the one shown in FIG. 1. The graphics card 100 shown in FIG. 1 comprises a GPU 110 which may be considered as a primary electronic component. The graphics card also comprises a number of RAM 120a and VRM 120b chips which may be considered as secondary electronic components. The graphics card may also have other secondary or tertiary electronic components. The primary and ancillary (secondary and tertiary) electronic components are integrated onto a motherboard to form a graphics card 100.

Cooling Architecture

Figure 3:
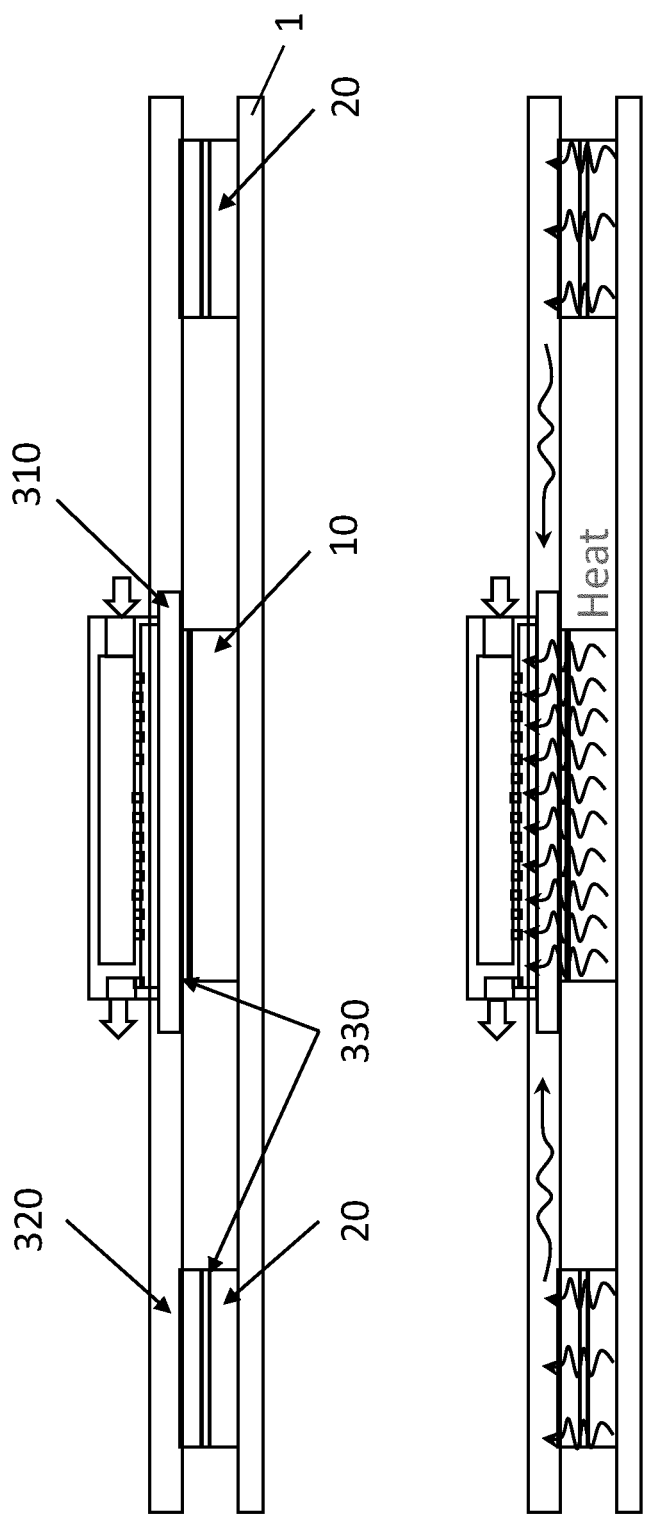
FIG. 3 is schematic showing a sectional view of a cooling device for cooling a multi-chip circuit board in accordance with the present teaching.

A schematic of a cooling architecture according to the present teaching is illustrated in connection with FIG. 3 which shows a schematic sectional view of a cooling device for cooling electronic components on a circuit board (1) in accordance with one embodiment of the present invention. As one can see from FIG. 3, the device comprises a first cooling component and a second cooling component. The first cooling component defines a primary cooling zone or region and is configured for cooling the primary electronic component 10. The second cooling component is configured for cooling the one or more secondary electronic components 20. The first cooling component is implemented based on convective heat transfer techniques or convection cooling. The first cooling component functions as a heat sink. The second cooling component is implemented based on conductive heat transfer techniques or conduction cooling.

The second cooling component is thermally coupled to the first cooling component. Where each of the first and second cooling components are formed as discrete elements, this thermal coupling may be effected by a first cooling member 310 of the first cooling component being thermally coupled to a second cooling member 320 of the second cooling component. Operatively, a thermal joint region is defined between each of the first cooling component and the second cooling component. The thermal joint region may extend about a perimeter of the primary electronic component 10 forming a temperature depression at the perimeter of the primary electronic component 10.

Such a cooling architecture focuses high-level convection cooling on the mission-critical primary electronic component 10 of an MCM. The innovative implementation of the thermal joint and a resultant cold zone between the convection cooling component and the conduction cooling component triggers heat diffusion from the hot peripheral secondary electronic components 20 to the cold zone created around the primary electronic component 10, which is ultimately transported to and removed by the convection cooling component.

According to some embodiments, the convection cooling operatively effected by the first cooling component has a first cooling effectiveness. The conduction cooling operatively effected by the second cooling component has a second cooling effectiveness lower than the first cooling effectiveness so as to operatively form the temperature depression at the perimeter of the first cooling component.

The first and second cooling members 310, 320 may be made of any suitable thermal conductive material. Metallic thermal conductive material such as copper and aluminium are particularly advantageous given their desirable thermal characteristics. For example, the first cooling member 310 may preferably be made of a metal such as copper to take advantage of its excellent thermal conductivity. The second cooling member 320 may be made of conductive material such as aluminium which has sufficient thermal conductivity and has further benefits such as light weight, high level of stiffness, and low cost. It will be appreciated that other types of thermal conductive materials, metallic or non-metallic, may be used for either the first or the second cooling member to achieve desirable thermal characteristics.

First Cooling Component

As mentioned earlier, the first cooling component for cooling the primary electronic component 10 is implemented using convection cooling, preferably liquid-based convection cooling, that is configured to provide high-intensity, high-effectiveness cooling. Within the present teaching liquid and fluid are used interchangeably.

The first cooling component may comprise a first cooling member. The first cooling member is configured to contact a surface of the primary electronic component which is to be cooled. In particular, the first cooling member defines a thermal surface. The thermal surface is configured to be in thermal contact with a surface of the primary electronic component to conduct heat from the primary electronic component. The thermal contact may be enhanced or aided by using a TIM, thermal adhesive, and/or thermal grease.

The first cooling member may be in the form of a thermal base plate having one side in contact with the primary electronic component. The other side of the base plate may be configured to be in fluid communication with a fluid to effect an operative convection cooling.

According to one embodiment, the first cooling component may be implemented based on convective heat transfer principles. Convective heat transfer is related to heat transfer between a body and a fluid flowing over or inside it as a result of the interaction of two objects. More specifically, conjugate heat transfer refers to the scenario which non-uniform convective cooling to a fluid phase atop a solid substrate induces thermal gradients within the solid, in such a way that thermal energy flows within the solid from hot regions to cold regions by conduction. This is the mechanism by which the first cooling component established the heat transfer path from the peripheral electronics, through the conduction plate and to the coolant fluid of the first cooling component.

Figure 4B:
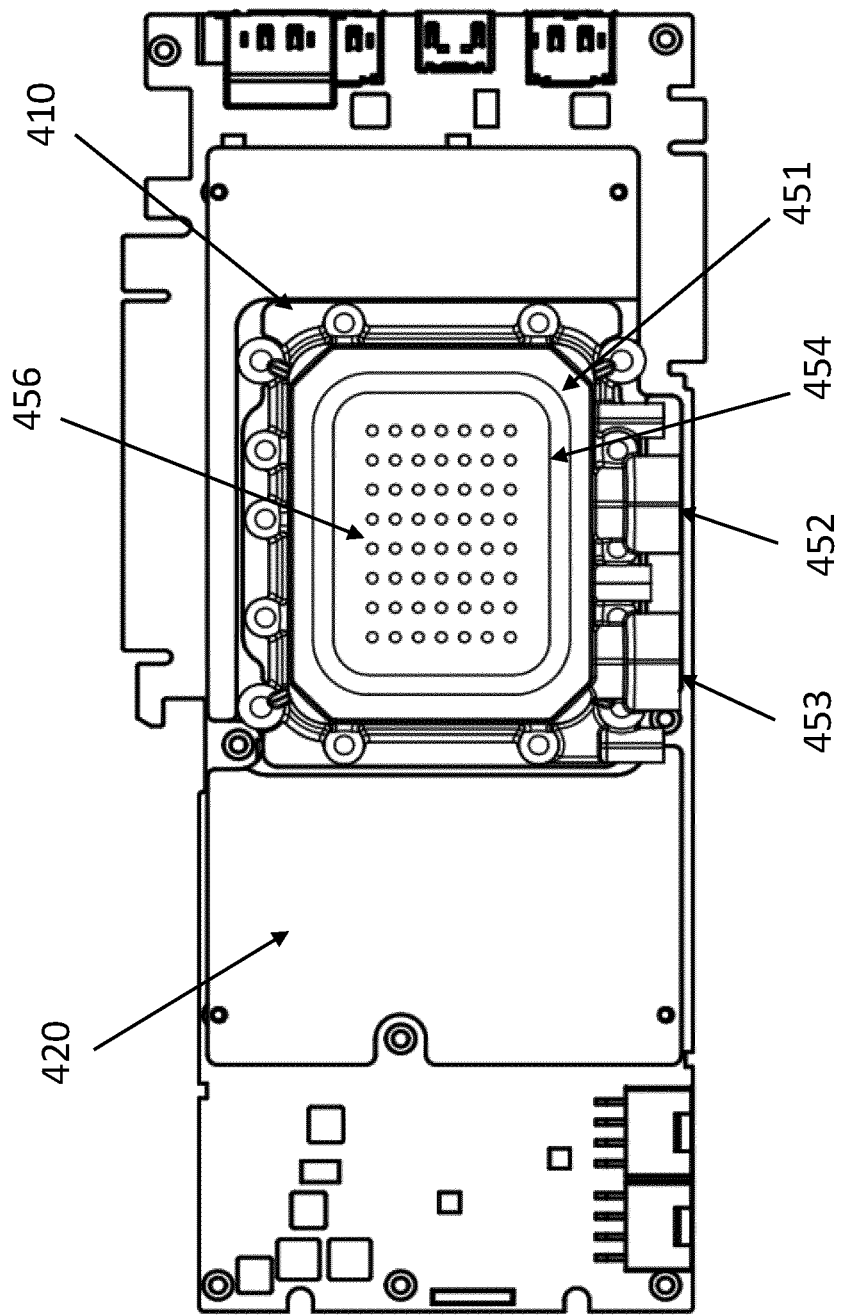
FIG. 4b is a schematic plan view from above of the device of FIG. 3 in accordance with the present teaching.

According to one embodiment, the conjugated convective heat transfer utilized by the first cooling component utilizes a liquid-based convection cooling component such as the one shown in FIGS. 4a and 4b. However, a skilled person would understand that other fluid-based convection cooling mechanisms may be utilized as long as they provide intensive cooling of the primary electronic component 110 with high cooling effectiveness. However generally speaking, liquid-based cooling is preferred due to its enhanced heat transfer effectiveness compared with air-based convection cooling.

According to some embodiments, the first cooling component comprises a housing defining a chamber configured to facilitate circulation of the fluid. The first cooling component comprises a conduction plate extending sidewardly from the housing. The thermal depression may operatively be formed in the conduction plate. The chamber may enclose a jet orifice plate through which the fluid impinges on the first cooling member to effect an operative convection cooling of the first cooling member to effect a corresponding operative cooling of the primary electronic component.

An advantageous convection cooling according to the present teaching will be described in detail in connection with FIGS. 4a and 4b.

According to some embodiments, the high-level convection cooling may utilize thermal-hydraulics to implement highly effective jet array impingement heat transfer directly on a surface of the primary electronic component (e.g. a processing unit such as CPU or GPU). This may be facilitated by a sealed waterblock-type impinging jet assembly 450 or simply referred to as a "waterblock", mounted on the primary processing unit. Jet array impingement heat transfer involves the forcing of high velocity water jets from a patterned array of nozzles onto a heated metal base, referred to as a thermal base plate.

An exemplary embodiment of such a first cooling component is shown in FIGS. 4a and 4b. The impinging jet assembly 450 may comprise a housing 451 having a fluid inlet 452 and a fluid outlet 453. The fluid inlet 452 may be in fluid communication with a plenum chamber 454. The plenum chamber 454 may be wholly defined within the housing and comprise a jet orifice plate 456 which defines a plurality of jet orifices. The jet orifices may be distributed across the surface of the jet orifice plate to form an impinging microjet array plate 456. The impinging microjet array provides a fluid outlet through which a pressurised liquid can operably exit the plenum chamber. On exiting the impinging microjet array, the pressurised fluid may contact the thermal surface and operably dissipates heat away from that thermal surface. The impinging jet assembly 450 is configured to operably direct that heated fluid away from the first cooling member 410 (e.g. a thermal base) to exit the assembly via the fluid outlet 230. The first cooling member 410 is arranged to thermally conduct heat away from the primary electronic component 110. The first cooling member 410 may comprise a planar upper surface such that the pressurised fluid contacts that planar surface and dissipates heat away from that surface. In another configuration, the upper surface of the first cooling member 410 may not be planar. For example, it may comprise one or more raised surfaces or perturbations that operatively increase the area of the contact surface with which the pressurised fluid contacts. These raised surfaces or perturbations may adopt one or more different geometrical forms, such as for example dimples or fins that project upwardly towards the jet orifice plate 456.

To effectively direct the heated fluid away from the first cooling member 410, the housing may define at least one exit channel, the exit channel being configured to deliver fluid exiting the impinging microjet array to the fluid outlet 453.

The housing 451 is configured to be top mounted onto the primary electronic component such as a CPU or GPU. The housing can be secured relative to the primary electronic component 110 through any suitable fixing means such as a mechanical fixing of threaded screws of the housing relative to the substrate on which the primary electronic component is located.

By top mounting the housing relative to the primary electronic component that is to be cooled, liquid passing through the jet orifices is operably directed downwardly under pressure in a direction towards the primary electronic component.

The impinging microjet array plate 456 may define a base of the plenum chamber. The plenum chamber further comprises side walls extending upwardly from the base. In such an arrangement, the exit channel desirably shares the side walls with the plenum chamber, the plenum chamber being provided on a first side of the side walls and the exit channel being provided on a second side of the side walls.

In a first configuration of the waterblock 450, such as that shown in FIG. 4b, the exit channel is wholly defined within the housing, such that the housing comprises a distinct plenum chamber and a distinct exit channel, each being in respective fluid communication with the fluid inlet and the fluid outlet 453. In exemplary configurations shown in FIG. 4a, each of the fluid inlet and fluid outlet are perpendicularly offset from the jet orifices. In certain configurations at least one of the inlet and outlet are perpendicularly offset (not shown).

In this configuration, the plenum chamber 454 is provided on a first side of the impinging microjet arrayplate 456 and the exit channel is provided on a second side of the impinging microjet arrayplate 456, the impinging microjet array plate 456 defining at least a portion of an upper surface of the exit channel, the thermal surface defining at least a portion of a lower surface of the exit channel. In the example of FIGS. 4a and 4b, the first cooling member 410 is formed from a thermally conductive material such as copper, which is mechanically fixed to the remaining portions of the housing 451. A flange in this exemplary arrangement, formed by an o-ring is seatable within an o-ring channel 266 formed in the housing and which when the thermal base plate 410 is mechanically fixed to the housing 451 forms a fluid tight seal such that water entering the exit channel cannot leak before exiting through the exit port 453. It will be appreciated that the first cooling member 410 could also be formed as an integral component of the overall housing.

The high velocity of the jets enables the exceptionally high convective heat transfer coefficients to enable highly effective cooling of the high-powered primary electronic component (e.g. GPU) without wasting any of the coolant volume flow on the less critical and significantly lower powered ancillary (secondary/tertiary) electronic components (e.g. RAM and VRM). The pressure drop could be almost entirely associated with the contraction of the fluid into the nozzles, making it moderate in magnitude at target volumetric flow rates.

In addition to the features and configurations that will be appreciated from the discussion herein, the first cooling component may include features and components in accordance with those described in published International Patent Application PCT/EP2019/070713.

Second Cooling Component

A device in accordance with the present teaching also comprises a second cooling component configured for cooling one or more secondary electronic components. The second cooling component is thermally coupled to the first cooling member. According to some embodiments, the second cooling component may extend about a perimeter of the first cooling component. For example, the second cooling component may form a skirt area extended laterally from the first cooling component.

According to the embodiment shown in FIGS. 4a and 4b, the second cooling component comprises a second cooling member 420. It will be appreciated that the second cooling component may itself be equivalent to the second cooling member 420 and thus the two terms may be used interchangeably in some embodiments. The thermal coupling is effected by the first cooling member 410 of the first cooling component being thermally coupled to the second cooling member 420 of the second cooling component.

The second cooling member 420 comprises a cooling proximal region which is the region adjacent to the perimeter of the first cooling component. The cooling proximal region is configured to thermally couple to the first cooling member 410 of the first cooling component. This operatively creates a thermal joint between the first cooling component and the second cooling component. The thermal joint region extends about a perimeter of the primary electronic component. In creating this thermal joint, a temperature depression or a cold zone is formed at the perimeter of the first cooling component surrounding the primary electronic component, as shown as the region 600 in FIG. 6. This in effect establishes the conjugate heat transfer mechanism owing to the aggressive convective cooling in the primary cooling region and low convective cooling in the cooling proximal region such that the path of least thermal resistance resides within the second cooling member 420 by conductive heat transfer between the heat source(s) (ancillary electronics) and the heat sink (the first cooling component). The cold zone is the lowest temperature region of the first and second cooling members 410, 420.

The second cooling member 420 also comprises a cooling distal region. The cooling distal region corresponds to the region of the second cooling member 420 that is configured to make thermal contact with the one or more secondary electronic components 120 to facilitate thermal conduction.

In operation, the temperature of the cooling distal region is raised by the heat generated by the one or more secondary electronic components. A thermal gradient is operatively established between the cooling proximal region and the cooling distal region. This created thermal gradient ensures that heat generated by the secondary electronic components is passed to the first cooling member 410 which is cooled by the first cooling component. As a result, the cooling distal region operatively draws heat from the secondary electronic components via conductive heat transfer. The areas of the second cooling member 420 within which conductive heat transfer take place effectively form one or more conduction cooling areas. In certain embodiments, the conduction plate 420 may comprise a first region 421 having a first thickness and a second region 422 having a second thickness, the first thickness being larger than the second thickness.

According to some embodiments, the second cooling member 420 may be a conduction plate configured to act as a thermal bus to conduct heat from the one or more secondary electronic components to the first cooling member of the first cooling component. In particular, this may be achieved by arranging the conduction plate in thermal contact with a surface or surfaces of the one or more secondary electronic components. The thermal contact may be effected, for example, by physically abutting a surface of the conduction plate with the one or more surfaces of the one or more secondary electronic components. The thermal contact may be aided or enhanced by placing a TIM, thermal grease, and/or thermal adhesive, etc. between the two surfaces.

As previously mentioned, the second cooling component may form a skirt area extended laterally from the first cooling component. It will be appreciated that depending on the arrangement of the secondary electronic components, the skirt area formed by the second cooling component may adopt any suitable shape to effect a sufficient thermal coupling with the one or more secondary electronic components. For example, the first and second cooling components may be arranged to match a specific circuit board design.

According to some embodiments of the present teaching, the second cooling member 420 may operatively define one or more thermal conduction channels. The thermal conduction channels define thermal conduction paths along which heat will preferentially pass. Operatively, one or more channels of raised cross-sectional area above or below the thermal bus plate can be strategically arranged to thermally link one or more discrete secondary heat source (secondary electronic component) to the primary cooling zone. This provides preferentially lower thermal resistance and subsequently lower operating temperature of the component(s) without requiring the expansion of the entire thermal bus plate thickness only to target one or few of the secondary components. In essence, the conduction channels operate as lateral or transverse thermal vias.

Figure 5:
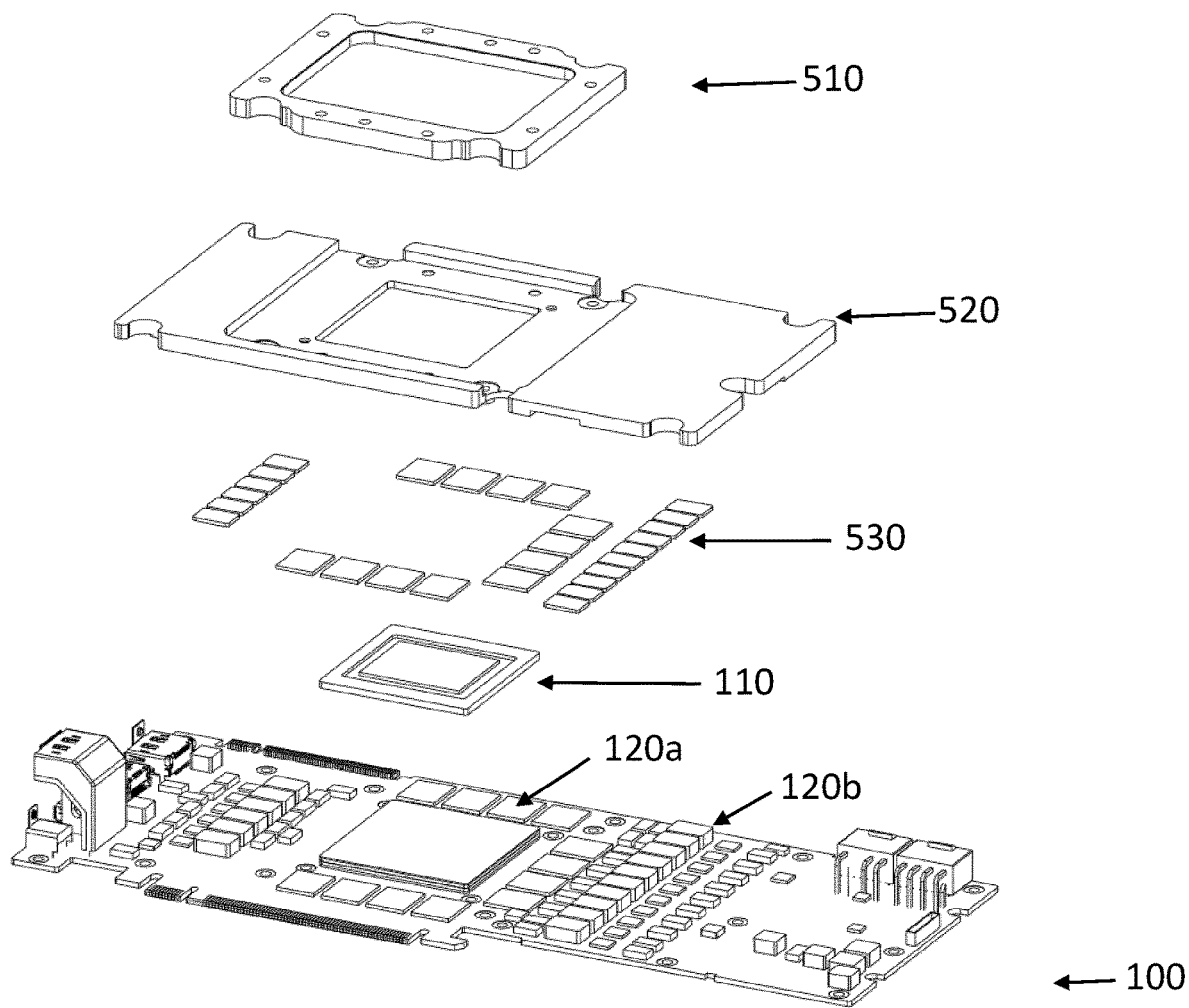
FIG. 5 is a schematic exploded view of a cooling device in accordance with the present teaching.

FIG. 5 shows a schematic exploded view of an exemplary cooling device which may be used for cooling a graphics card 100. As one can see from FIG. 5, the first cooling member is a thermal base plate 510 formed from a piece of thermally conductive material. The second cooling member is a conduction plate 520 formed from a piece of thermal conductive material. The conduction plate 520 acts as a thermal bus to conduct heat from the secondary electronics to the thermal base plate 510. In this example, the conduction plate 520 has an opening configured to receive the thermal base plate 510. The thermal base plate 510 is configured to fit the receiving opening of the conduction plate 510. The thermal base plate has a flange configured to fit a receiving frame of the thermal base plat 510. The flange and the receiving frame are configured to form an overlapped joint region.

As one can see from FIG. 5, the thermal base plate 510 is located at substantially a central region of the cooling device to at least overlap and thermally contact the GPU 110. The conduction plate 520 is configured to extend laterally on all sides from the thermal base plate 510 to thermally couple to the VRM 120*b* and RAM 120*a* chips. The thermal coupling between the conduction plate and the RAM/VRM 120 chips is aided by a TIM 530. The thermal contact between the thermal plate 510 and the CPU 110 may be enhanced by thermal grease. The thermal bus adopts an asymmetrical shape in that one side is in a size larger than other sides to facilitate cooling of the larger number of more VRM/RAM chips on this particular side.

According to some embodiments, the second cooling member may be a conduction plate of a uniform thickness. According to some other embodiments, the second cooling member may be a conduction plate of non-uniform or varying thickness. One example of such a non-uniform thickness configuration is one or more lateral thermal vias. Since the conduction plate used for compact cooling devices tend to be relatively thin (e.g. in a scale of 2 mm thickness), the thickness of the conduction plate may significantly affect the cooling effectiveness offered by the conduction plate. For example, a heat transfer resistance in a direction lateral to the plane of the conduction plate is inversely proportional to the thickness of the conduction plate. Therefore, by increasing the thickness, an effective spreading thermal resistance between secondary components and the first cooling member is reduced. Operationally, the effective thermal resistance between the heat source and heat sink is lowered which positively influences the operating temperature of the electronic component(s).

It is therefore possible to tune the level of cooling offered to different secondary electronic components by altering the thickness of the regions of the conduction plate to which the secondary electronic components are thermally coupled. To achieve this, the conduction plate may comprise a first region having a first thickness and a second region having a second thickness, the first thickness being larger than the second thickness. Accordingly, the conduction plate may be configured such that the first region overlaps a first set of the one or more secondary electronic components and the second region overlaps a second set of the one or more secondary electronic components. For example, the thermal base plate can be configured to have thicker regions overlapping and in thermal contact with relatively high-powered secondary electronics to effectively balance the temperature. In the context of graphics card cooling, VRM typically generates more heat than RAM and thus require a higher-level of cooling. By configuring the conduction plate to have thicker regions thermally overlapping the VRM, a more balanced cooling can be achieved.

It will be appreciated that the conduction plate may be configured to adopt various thickness profiles. It will also be appreciated that the variation in thickness may be stepwise so that distinct stages are formed or continuous/gradual to effect different cooling profile to suit various applications.

According to some embodiment of the present invention, the device may further comprise a third cooling component. Similar to the second cooling component, the third cooling component may comprise a third cooling member configured to effect an operative conduction cooling of one or more tertiary electronic components. The various embodiments and configurations described in conjunction with the second cooling component may be equally applicable for the third cooling component and are not reiterated herewith. It will be appreciated that the cooling device according to the present teaching may comprise further levels of cooling components to effect cooling of boards of various ancillary electronic component profiles. The cooling device of the present teaching is thus versatile in that it can be easily modified and/or adapted to suit cooling of boards of various profiles of primary and ancillary electronic components of various numbers and sizes.

Operative Cooling by the First and Second Cooling Components

The cooling device according to the present teaching leverages the superior convection (e.g. thermal-hydraulic) performance of the first cooling component to not only cool the high-powered primary electronic component, but also to create thermal depressions in the second cooling member, thus instigating the conjugate heat transfer mechanism. According to some embodiments, the convection cooling operatively effected by the first cooling component has a first cooling effectiveness. The conduction cooling operatively effected by the second cooling component has a second cooling effectiveness lower than the first cooling effectiveness so as to operatively form the temperature depression at the perimeter of the first cooling component.

The thermal depression effectively draws the lower level heat created by the one or more secondary electronic components to the primary cooling component. By focusing all of the available coolant centrally at the primary electronic component, the first cooling component intensively cools the mission-critical primary electronic component with the highest cooling effectiveness within the cooling device/ assembly. The cooling effect of the first cooling component extends to the second cooling component which operatively cools the secondary electronic components in a relatively low (e.g. proportional to its cooling effectiveness) but sufficient level. The result is high-performance convection-based cooling where it is crucial and conduction-based cooling on the less critical secondary electronics on the board.

The area in which the convection cooling takes place may be referred to as a convection cooling area. The surface of the primary electronic component with which the first cooling component is in thermal contact may be referred to as a thermal contact surface of the primary electronic component. The convection cooling area may at least overlap the area of the thermal contact surface of the primary electronic component to achieve an effective high-level cooling of the primary electronic component.

An effect of such a high-level, intensive cooling of the primary electronic component is that it removes waste heat generated by the high-powered primary electronic component with high effectiveness to ensure that the component operates below its maximum operating temperature. Another advantageous effect achieved by such a configuration is that the high-level cooling at the primary electronic component creates a cold zone about the perimeter of the first cooling component.

As the cooling proximal region of the second cooling member is in close thermal contact with the first cooling member which experiences high-level cooling effected by the first cooling component, the temperature of the cooling distal region tends to have the lowest temperature of the second cooling member. In comparison, as the cooling distal region of the second cooling member is thermally coupled to the secondary electronic components and thus operatively draws low level heat created by the secondary electronic components, the cooling distal region tends to have a temperature higher than that of the cooling proximal region. Effectively, a thermal gradient may be induced or established between the cooling proximal region and the cooling distal region of the second cooling member. As a result, heat generated by the one or more secondary components will thermally pass to the first cooling component via the first cooling member, and ultimately dissipated from the first cooling component.

Taking cooling a graphics card 100 as an example, a high-level cooling is applied to the high-powered GPU via a thermal base plate 510 (e.g. a copper substrate). Around the periphery of the intensively cooled thermal base, a thermal joint is created between the thermal base plate and a thermal bus plate or conduction plate 520 (e.g. an aluminium plate). In creating this thermal joint, a cold zone is created on the cooling proximal region of the thermal bus plate 520 since it is in direct contact with the convection-cooled copper base plate 510. The cold zone is the lowest temperature region of the thermal bus plate 520. When the RAM 120a and VRM 120b chips generate heat, the cold zone creates thermal gradients between the hot chip regions and the cold thermal joint region. The created thermal gradients ensure that heat generated by the RAM 120a and VRM 120b chips will be thermally passed to the thermal base plate 510 which is cooled by the convection cooler. Without such a cold zone/temperature depression, as the heated GPU 110 tends to generate a large amount of heat which creates region of the highest temperature, a thermal gradient of the opposite direction may be created which passes the heat generated by the GPU 110 to the distal region of the thermal bus 520. This will have the detrimental effect of heating the VRM 120b and the RAM 120a chips rather than cooling them.

Figure 6:
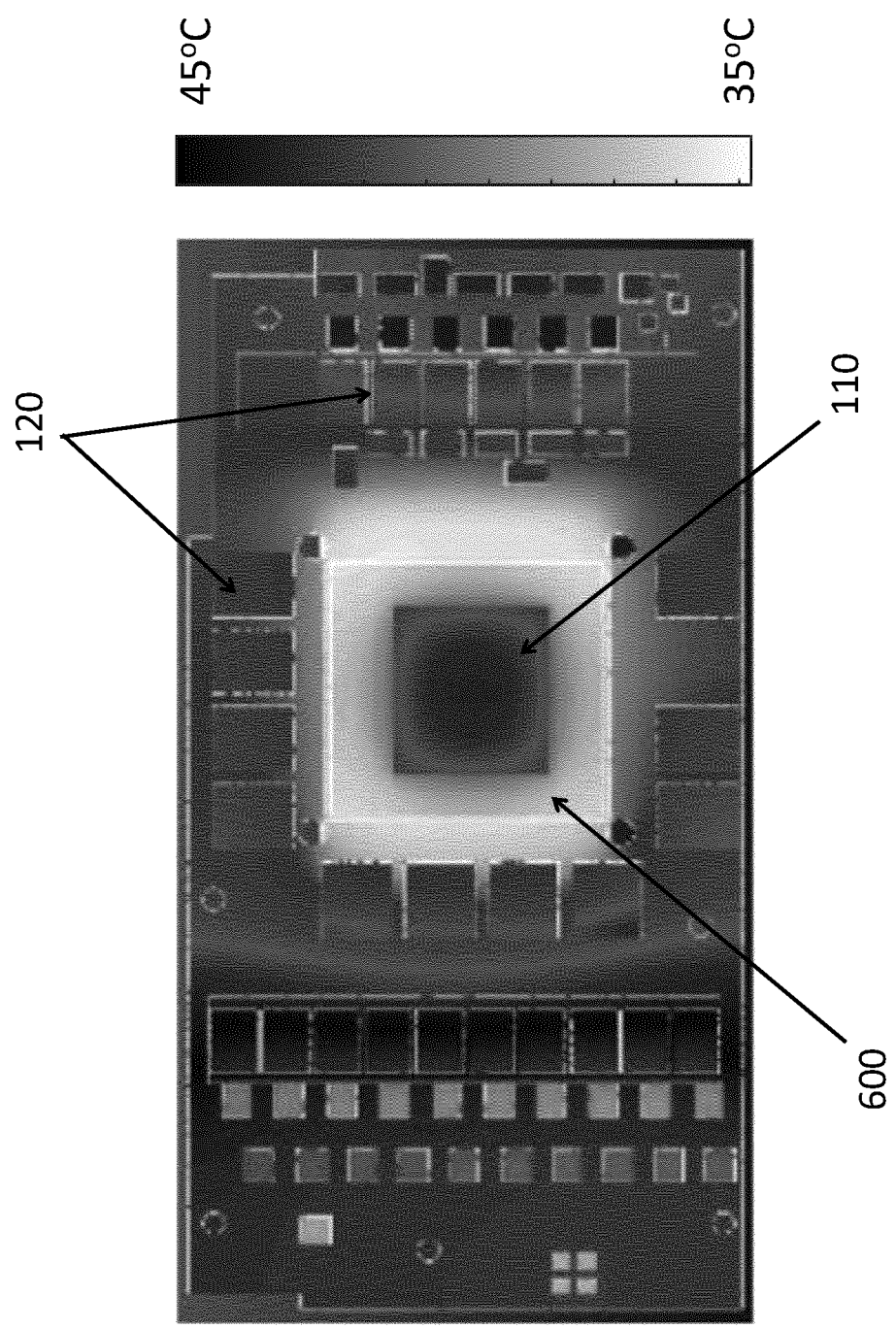
FIG. 6 shows a simulation result of heat distribution map of a circuit board being operatively cooled by a cooling device in accordance with the present teaching.

To better illustrate the advantageous effects achieved by the present teaching, an exemplary simulation result of a temperature distribution of a graphics card is shown in FIG. 6. One can see from FIG. 6 that a cold zone thermal depression region 600 of the lowest temperature is created about the perimeter of the thermal base plate or the GPU. The centre of the thermal base plate is in a higher temperature due to the heat generated by the GPU 110. The peripheral distal regions where the VRM and RAM chips 120 are located are in higher temperatures due to heat generated by these peripheral chips. The result is that the heat is drawn from the distal regions of the thermal bus to the cold zone 600 which is then removed by the first cooling component. Therefore, by carefully designing the thermal bus plate and thermal joint regions, the thermal gradient can be sufficient to transfer the heat energy between the heat sources (i.e.

RAM and VRM) and the sink (liquid-cooled base plate) whilst keeping them well below their maximum allowable operating temperatures.

Generally speaking, it is sufficient for the convection cooling area to be in substantially the same size as that of the thermal contact surface of the primary electronic component. However, in some embodiments, the convection cooling area may be larger than the thermal contact surface of the primary electronic component. This configuration is particularly useful in the case of a unitary cooling member. The result of this configuration is that the convection cooling area on the first cooling member that extends beyond and about the thermal contact surface contributes to the effective convection cooling in a much low level compared with the overlapping area. As a result, the thermal/temperature depression is enhanced which in turn effects a cold zone with even lower temperature.

In some embodiments, the first cooling member and the second cooling member may be formed from a common substrate. The two cooling members may be integrally formed with one another. The integrally formed first and second cooling members, collectively referred to as a unitary cooling member, may take the form of a thermal conductive plate which extends across the area overlapping the surfaces of a totality of the primary and secondary electronic components that require operative cooling. The unitary cooling member may define a first lateral surface and an opposite second lateral surface. The first cooling component (i.e. the convective cooling component) may be mounted to the first lateral surface. The second lateral surface may be in thermal contact with the primary and ancillary electronic components.

The thermal characteristics of the joint region may be modified by configuring the unitary member to have various dimension profiles, in particular, thickness profiles based on principles similar to those described earlier and are not reiterate herewith.

In an alternative embodiment, each of the first and second cooling members may be separate and distinct members. The second cooling member may physically abut the first cooling member. The example show in FIG. 5 corresponds to such an embodiment. In the embodiment where the first cooling member and second cooling member are separate and distinct members, in addition to dimension or thickness profiles, the thermal characterises of the joint region may also be modified the thermal conductive material used to form each of the members. The first and second cooling members may have the same or different thickness. For example, the first cooling member may be formed from a first conductive material. The second cooling member may be formed from a second thermal conductive material. The first and second thermal conductive material may be the same or different material depending on specific designs to facilitate different cooling operations. For example, the first cooling member may preferably be made of a metal such as copper to take advantage of its desirable thermal characteristics such as high thermal conductivity. The second cooling member may be made of conductive material such as aluminium which has sufficient thermal conductivity and benefits from light weight, high level of stiffness, and low cost. It will be appreciated that other types thermal conductive material may be used for both the first and the second cooling member to achieve desirable thermal characteristics.

The words comprises/comprising when used in this specification are to specify the presence of stated features, integers, steps or components but does not preclude the presence or addition of one or more other features, integers, steps, components or groups thereof.

The invention claimed is:

1. A thermal cooling device for cooling electronic components of a circuit board, the electronic components comprising a primary electronic component, and one or more secondary electronic components, the device comprising:
a first cooling component comprising a first cooling member configured to contact a thermal contact surface of the primary electronic component, the first cooling member being further configured to be in fluid communication with a fluid to effect an operative convective cooling of the thermal contact surface of the primary electronic component, the first cooling component comprising a microjet array defining a convection cooling area at least partially overlapping with the thermal contact surface of the primary electronic component and within which pressurised fluid operatively directly contacts the thermal contact surface to dissipate heat away from the thermal contact surface; and
a second cooling component comprising a second cooling member having a cooling distal region configured to contact a respective thermal surface of the one or more secondary electronic components to effect an operative conduction cooling of the one or more secondary electronic components, the second cooling member having a cooling proximal region thermally coupled to the first cooling member;
where the convection cooling operatively effected by the first cooling component has a first cooling effectiveness, the conduction cooling operatively effected by the second cooling component has a second cooling effectiveness lower than the first cooling effectiveness so as to operatively form a temperature depression at a perimeter of the first cooling component;
wherein the first cooling component comprises a housing defining a chamber configured to facilitate circulation of the fluid and the first cooling component further comprises a conduction plate extending sidewardly from the housing, the thermal depression operatively being formed in the conduction plate.

2. The device of claim 1, wherein the second cooling component extends about a perimeter of the first cooling component.

3. The device of claim 1, wherein operatively a thermal joint region is defined between each of the first cooling component and the second cooling component, the thermal joint region extending about the perimeter of the first cooling component forming the temperature depression at the perimeter of the first cooling component.

4. The device of claim 1, wherein each of the first and second cooling members are separate and distinct members, the second cooling member physically abutting the first cooling member; or
each of the first and second cooling members are formed from a common substrate or are integrally formed with one another.

5. The device of claim 1, wherein, operatively, a thermal gradient is established between a first cooling proximal region and a first cooling distal region such that heat generated by the one or more secondary components will thermally pass to the first cooling component.

6. The device of claim 1, wherein the first cooling member has a first footprint and the second cooling member has a second footprint, the first footprint being smaller than the second footprint.

7. The device of claim 1, wherein the convection cooling area of the first cooling component has a larger footprint than the footprint of the primary electronic component.

8. The device of claim 1, wherein the second cooling member is a conduction plate, the conduction plate comprising a first region having a first thickness and a second region having a second thickness, the first thickness being larger than the second thickness.

9. The device of claim 8, wherein the first region overlaps a first set of the one or more secondary electronic components and the second region overlaps a second set of the one or more secondary electronic components.

10. The device of claim 1, further comprising a third cooling component comprising a third cooling member configured to affect an operative conduction cooling of one or more tertiary electronic components, the third cooling member being thermally coupled to the second cooling member.

11. The device of claim 1, wherein when the first cooling member and second cooling member are separate and distinct members, and wherein the first cooling member is formed from a first conductive material and the second cooling surface is formed from a second conductive material, the first conductive material being different to the second conductive material; or the first cooling member and the second cooling members are formed from the same conductive material.

12. The device of claim 11 wherein the first cooling member has a thickness that is different to the thickness of the second cooling member.

13. The device of claim 11, wherein the first cooling member is formed from copper and the second cooling member is formed from aluminium.

14. The device of claim 1, wherein the second cooling member comprises one or more thermal conduction channels defined therein, the thermal conduction channels defining thermal conduction paths along which heat will preferentially pass.

15. The device of claim 1 wherein the chamber encloses a jet orifice plate through which the fluid impinges on the first cooling member to effect an operative convection cooling of the first cooling member to effect a corresponding operative cooling of the primary electronic component.

* * * * *